(12) United States Patent
Yen et al.

(10) Patent No.: US 6,750,392 B1
(45) Date of Patent: Jun. 15, 2004

(54) PHOTOVOLTAIC COOLING SYSTEM

(76) Inventors: Kuo-Yow Yen, 15 Terraza, Irvine, CA (US) 92614; Chung-Hou Tony Hsiao, 15 Terraza, Irvine, CA (US) 92614

( * ) Notice: Subject to any disclaimer, the term of this patent is extended or adjusted under 35 U.S.C. 154(b) by 0 days.

(21) Appl. No.: 10/456,464

(22) Filed: Jun. 6, 2003

(51) Int. Cl.$^7$ .............................................. H01L 31/052
(52) U.S. Cl. ...................... 136/246; 136/259; 136/291; 52/173.3
(58) Field of Search ................ 136/246, 259, 136/291; 52/173.3

(56) References Cited

U.S. PATENT DOCUMENTS

| | | | | |
|---|---|---|---|---|
| 4,558,634 A | * | 12/1985 | Oshiro et al. | 454/165 |
| 5,505,788 A | * | 4/1996 | Dinwoodie | 136/246 |
| 5,746,839 A | * | 5/1998 | Dinwoodie | 136/251 |
| 6,061,978 A | * | 5/2000 | Dinwoodie et al. | 52/173.3 |
| 6,570,084 B2 | * | 5/2003 | Dinwoodie | 136/251 |

FOREIGN PATENT DOCUMENTS

DE  3611542 A1 * 10/1987 .......... H01L/31/04

* cited by examiner

*Primary Examiner*—Alan Diamond
(74) *Attorney, Agent, or Firm*—Joe Nieh

(57) ABSTRACT

A passive convection cooling system for photovoltaic panels utilizing principles of aerodynamics to channel natural air flow under the photovoltaic panels and to increase the rate of heat transfer to greatly increase the convection rate and decrease the temperature of the photovoltaic panels thereby increasing the efficiency of the solar cells and decreasing failures of the photovoltaic system is disclosed. The photovoltaic cooling system comprises of multiple members arranged in predetermined configurations and affixed under the photovoltaic panel to direct natural air flow, according to aerodynamic principles, to increase rate of heat transfer under the photovoltaic panel to greatly increase the convection rate to effectively cool the photovoltaic system.

6 Claims, 16 Drawing Sheets

PHOTOVOLTAIC COOLING SYSTEM

BACKGROUND-FIELD OF INVENTION

The present invention relates generally to a photovoltaic cooling system. More specifically, the present invention is a passive cooling system for photovoltaic panels.

BACKGROUND-DESCRIPTION OF RELATED ART

The collection of solar energy takes many forms. The most desirable configuration is the direct conversation of solar energy to electricity. The heart of the photovoltaic system is a thin flat layer of semiconductor material. When the material is struck by sunlight, electrons are freed, producing an electric current. The direct-current (DC) power is passed through a DC load, into a storage battery, or converted to alternating current (AC) for general use in electric utility grid. Typically, individual solar cells are ganged together to form photovoltaic modules. Typically, about half the cost of a solar system lies with the solar cell modules, and the remainder is directed toward power conditioning, electrical wiring, installation, and site preparation.

Typically, silicone or gallium arsenide is used to fabricate solar cells, although other semiconductor materials are being developed. Silicone technology is the most advanced because it is the least expensive, and takes many different forms including single-crystal, polycrystal, and amorphous configurations.

The efficiency of solar cells decreases as the temperature of the solar cells increases. Furthermore, increasing temperature also has detrimental effects on other components of the photovoltaic system, including thermal stress which may result in failures in the photovoltaic system. Therefore, a method to cool the photovoltaic system is desirable.

Cooling can be provided by both active and passive systems. Active cooling systems include Rankine cycle system and absorption system, both of which require additional hardware and costs. Passive cooling systems make use of three natural processes: convection cooling; radiative cooling; and evaporative cooling from water surfaces exposed to the atmosphere.

SUMMARY OF THE INVENTION

The present invention is a passive convection cooling system for photovoltaic panels utilizing principles of aerodynamics to channel natural air flow under the photovoltaic panels and to increase the rate of heat transfer to greatly increase the convection rate and decrease the temperature of the photovoltaic panels thereby increasing the efficiency of the solar cells and decreasing failures of the photovoltaic system. The photovoltaic cooling system comprises of multiple members arranged in predetermined configurations and affixed under the photovoltaic panel to direct natural air flow, according to aerodynamic principles, to increase the rate of heat transfer under the photovoltaic panel to greatly increase the convection rate to effectively cool the photovoltaic system.

DETAILED DESCRIPTION OF THE PREFERRED EMBODIMENT

Figure 1:
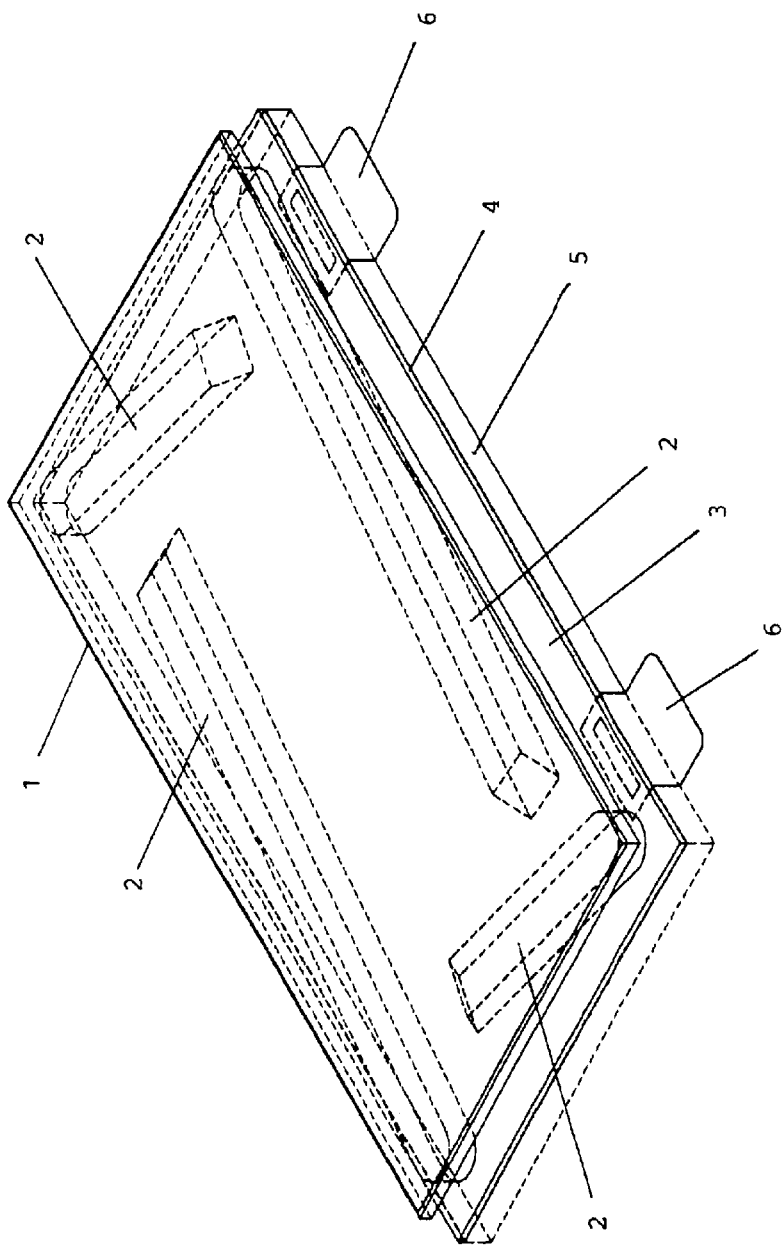
FIG. 1 shows a perspective view of the preferred embodiment of the photovoltaic cooling system.

The current preferred embodiment of the photovoltaic cooling system is shown in FIG. 1. The photovoltaic cooling system comprises of solar module 1, members made of polyisocynurate foam with grout coating 2, stucco base 3, galvanized netting reinforcement 4, and polyisocynurate foam insulation 5. The solar module 1 comprises of interconnecting solar cells arranged on a rectangular plane. Four elongated rectangular members 2 made of polyisocynurate foam with grout coating are attached under and around the rectangular solar module 1. One end of the elongated member 2 is rounded and the other end of the elongated member 2 has a forty five degree angle from top to bottom. The elongated members 2 on the longer sides are offset by approximately five degrees and parallel to each other. The elongated members 2 on the shorter sides are offset by approximately ten degrees and parallel to each other. The offset ends, which have a forty five degree angle from top to bottom, are arranged near the non-offset ends, which are rounded, of the adjacent elongated members 2.

Grout coating with stucco base 3 is used as the base for the solar module 1 with galvanized netting reinforcement 4 affixed to stucco mix to reduce vibration and increase crack resistance of the stucco mix. A layer of polyisocyanurate foam insulation 5 is affixed to the stucco for insulation. Two connectors 6 are affixed to one of the longer sides of the base for connection to the next solar module.

When natural air flow enters under the solar module 1, the elongated members 2 under the solar module 1 will direct the air flow, in accordance with aerodynamic principles, to increase the heat transfer under the solar module 1 to greatly increase the convection rate and increase the effective cooling rate of the solar module 1.

Figure 2:
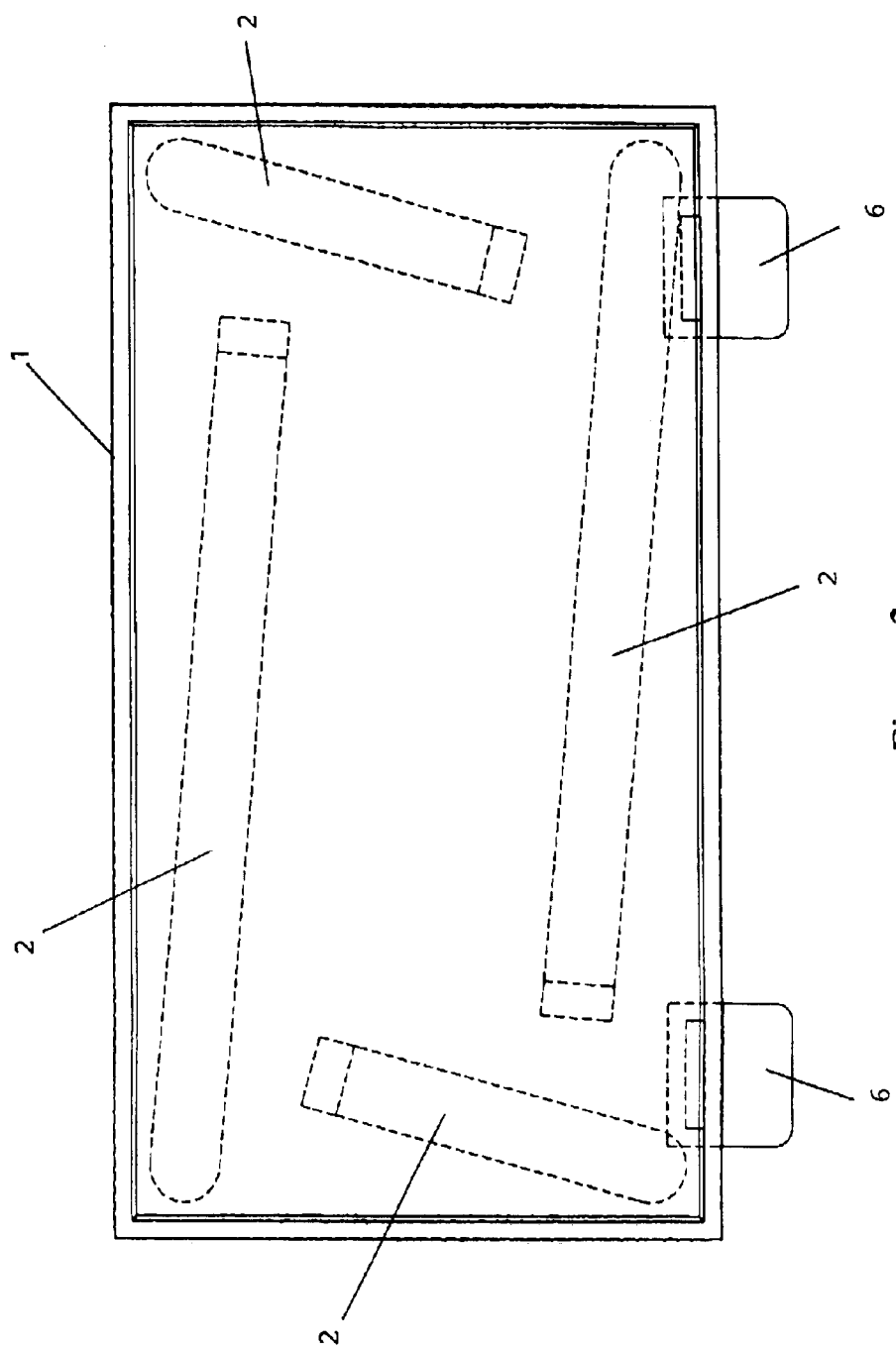
FIG. 2 shows the top view of the preferred embodiment of the photovoltaic cooling system.

FIG. 2 is the top view of the photovoltaic cooling system shown in FIG. 1.

Figure 3:
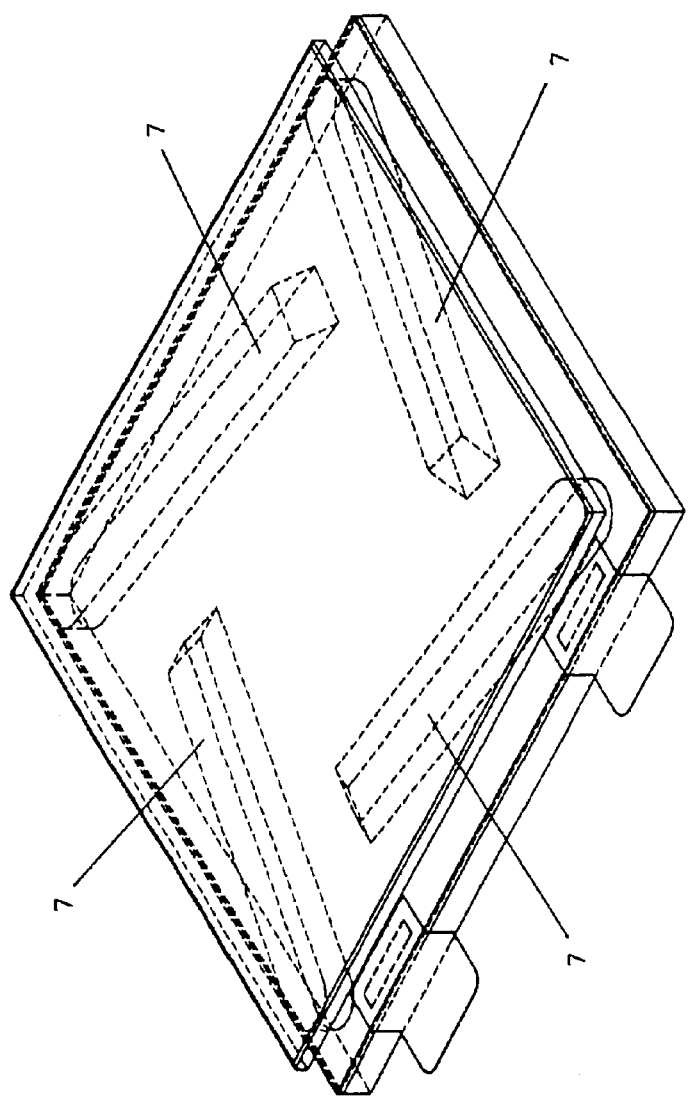
FIG. 3 shows a perspective view of another embodiment of the photovoltaic cooling system.
Figure 4:
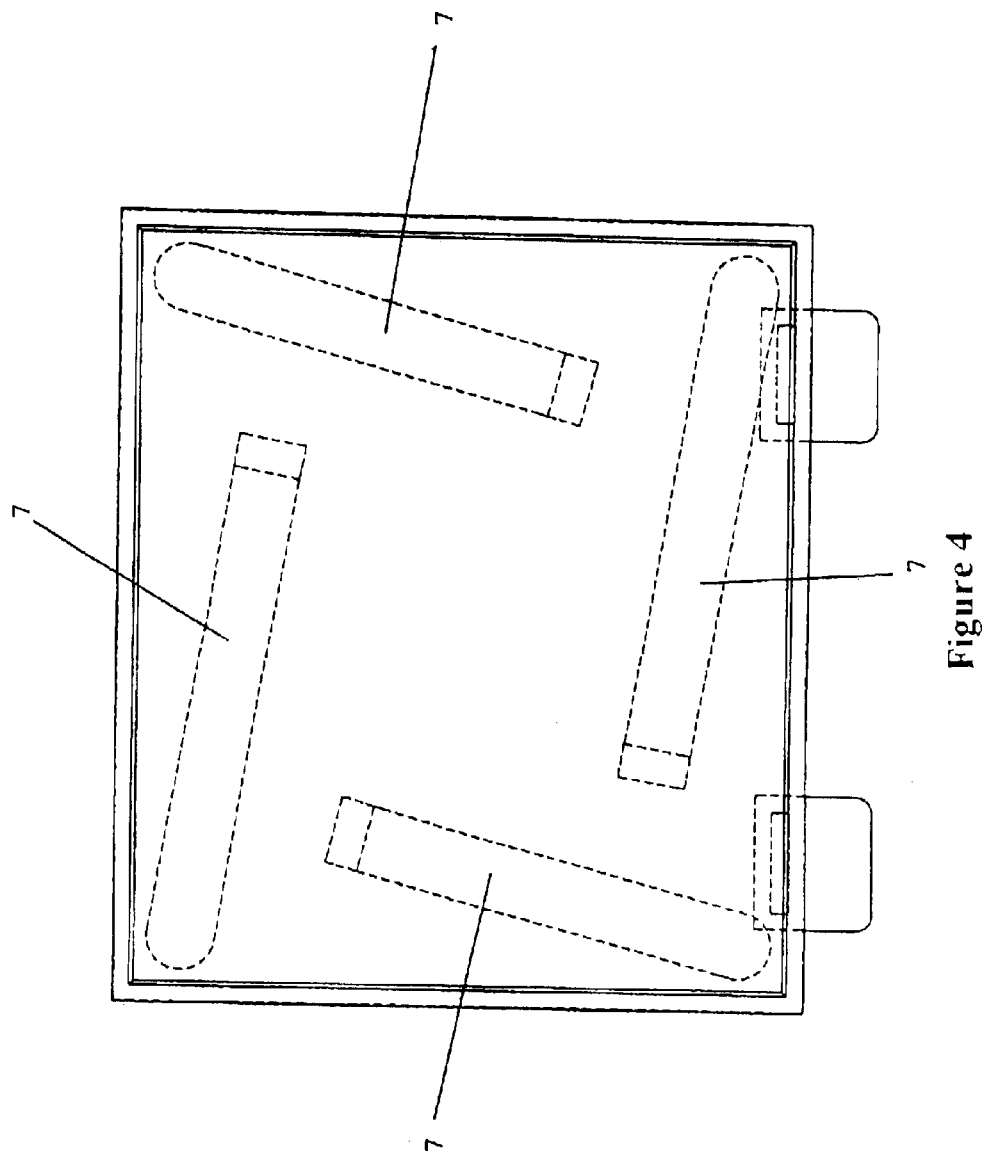
FIG. 4 shows the top view of the photovoltaic cooling system shown in FIG. 3.

FIG. 3 shows a photovoltaic cooling system with a relatively square solar module. Under the solar module are attached four elongated rectangular members 7. One end of the elongated member 7 is rounded and the other end of the elongated member 7 has a forty five degree angle from top to bottom. One end of each elongated member 7 is offset by approximately ten degrees from the edge of the solar module. The offset ends, which have a forty five degree angle from top to bottom, are arranged near the non-offset ends, which are rounded, of the adjacent elongated members 7. FIG. 4 is the top view of the photovoltaic cooling system shown in FIG. 3.

Figure 5:
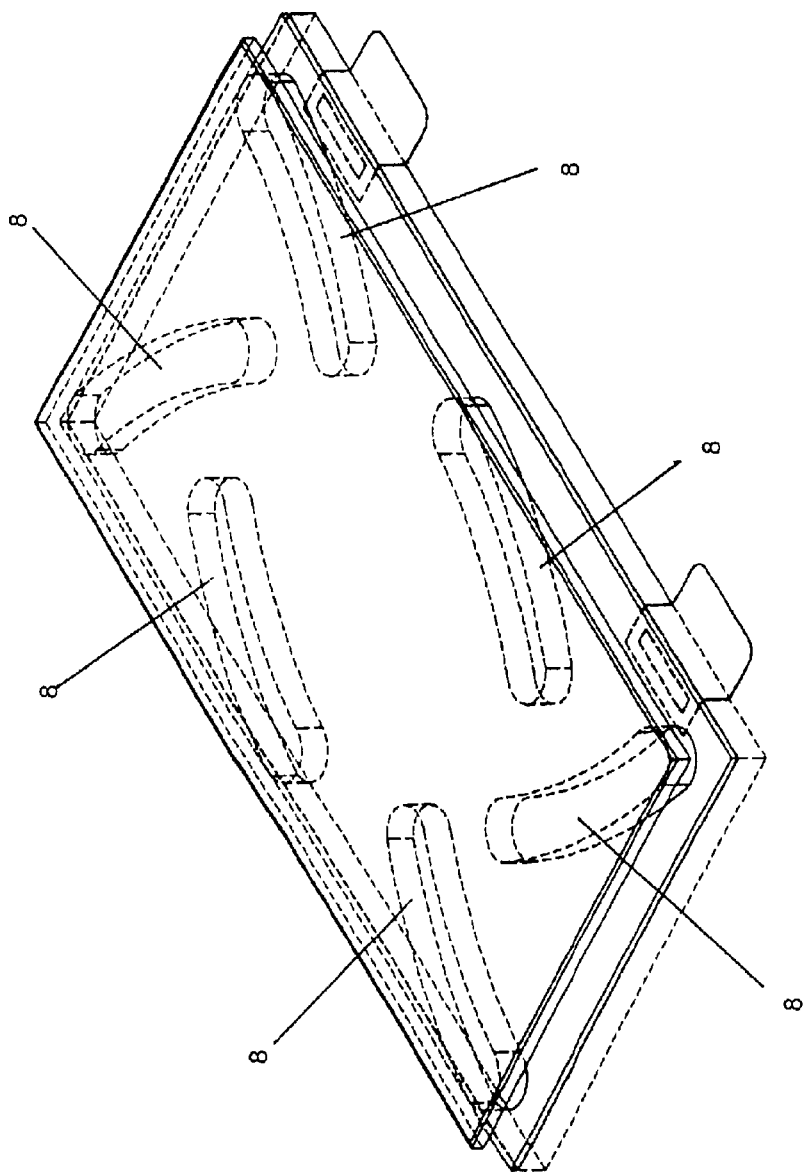
FIG. 5 shows a perspective view of another embodiment of the photovoltaic cooling system.
Figure 6:
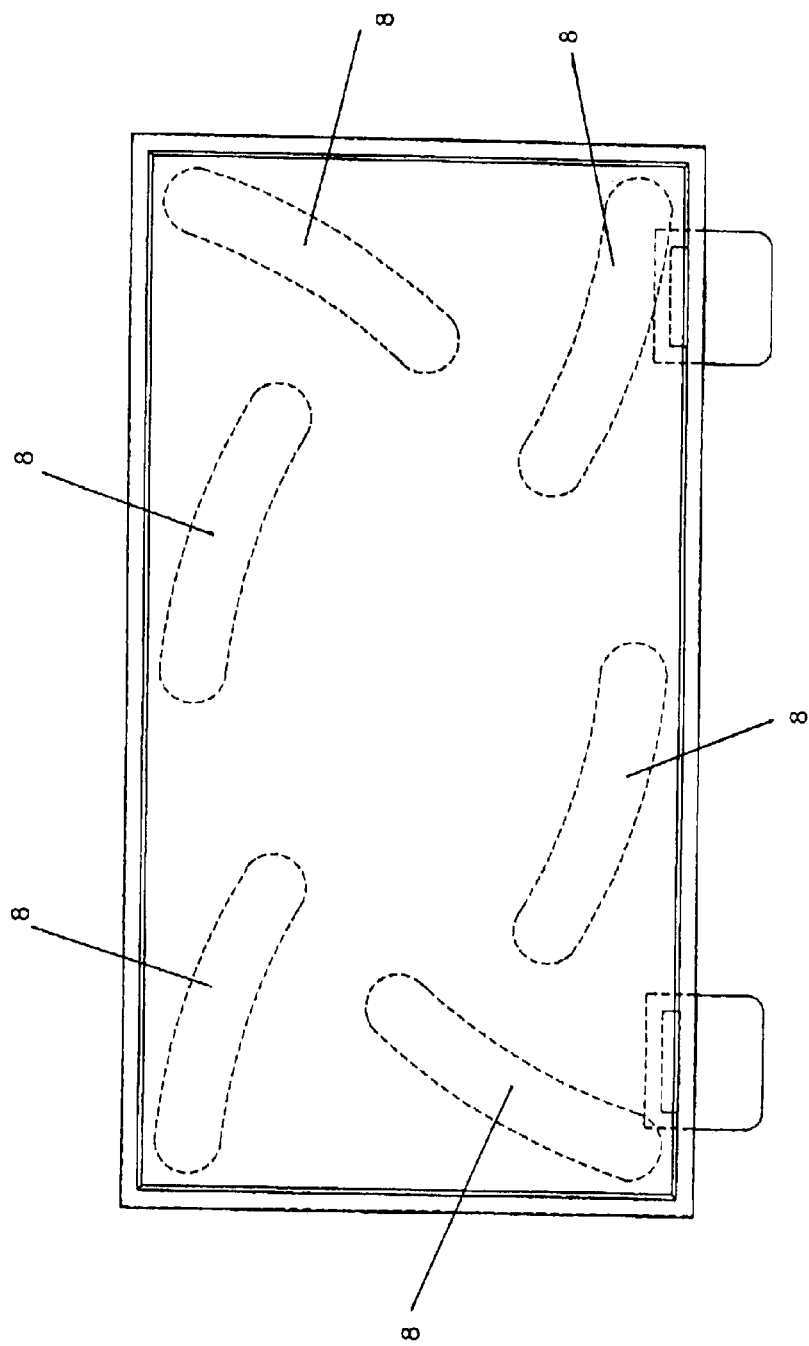
FIG. 6 shows the top view of the photovoltaic cooling system shown in FIG. 5.

FIG. 5 shows another embodiment of the photovoltaic cooling system. In this embodiment, six elongated curved members 8 shaped generally in the form of an arc are attached under a generally rectangular solar module. Four of the elongated curved members 8 are attached under the solar module with one end near a corner and the other end directed generally toward the center of the solar module. The other two elongated curved members 8 are attached under the solar module with one end near the longer sides of the solar module and the other end offset towards the center of the solar module. FIG. 6 is the top view of the photovoltaic cooling system shown in FIG. 5.

Figure 7:
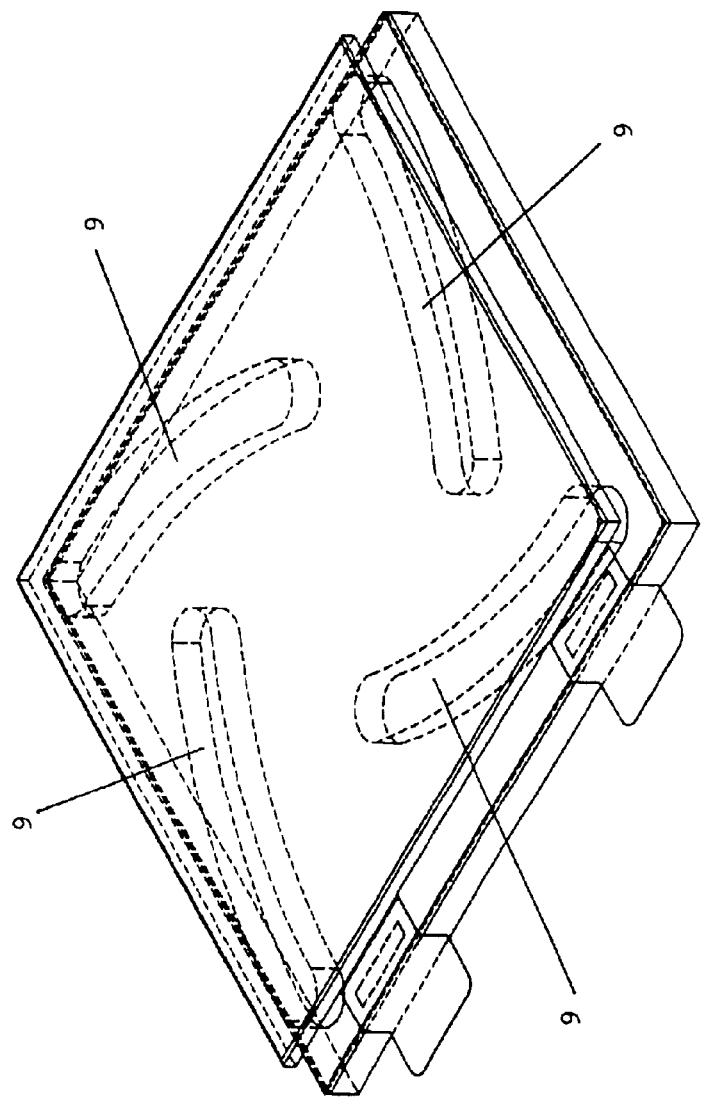
FIG. 7 shows a perspective view of another embodiment of the photovoltaic cooling system.
Figure 8:
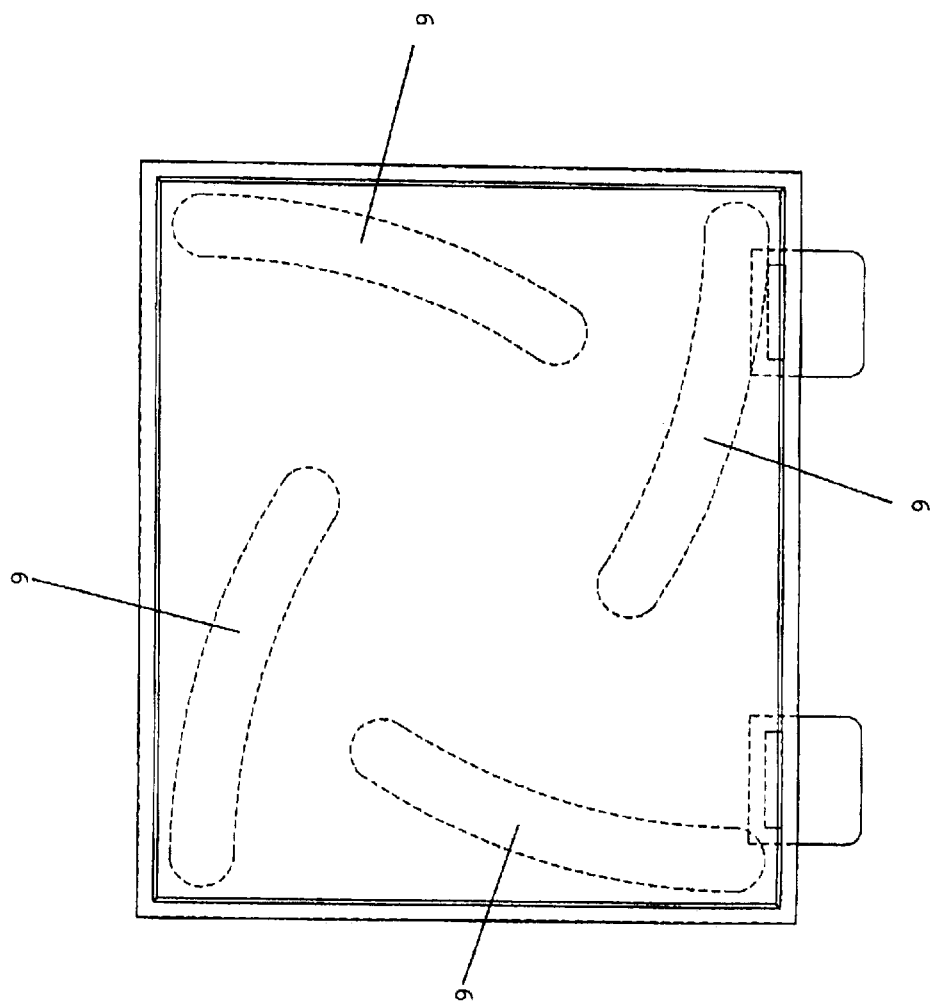
FIG. 8 shows the top view of the photovoltaic cooling system shown in FIG. 7.

FIG. 7 shows a photovoltaic cooling system with a relatively square solar module. Under the solar module are attached four elongated curved members 9 shaped generally in the form of an arc. Each of the four elongated curved members 9 are attached under the solar module with one end near a corner and the other end directed generally toward the center of the solar module. FIG. 8 is the top view of the photovoltaic cooling system shown in FIG. 7.

Figure 9:
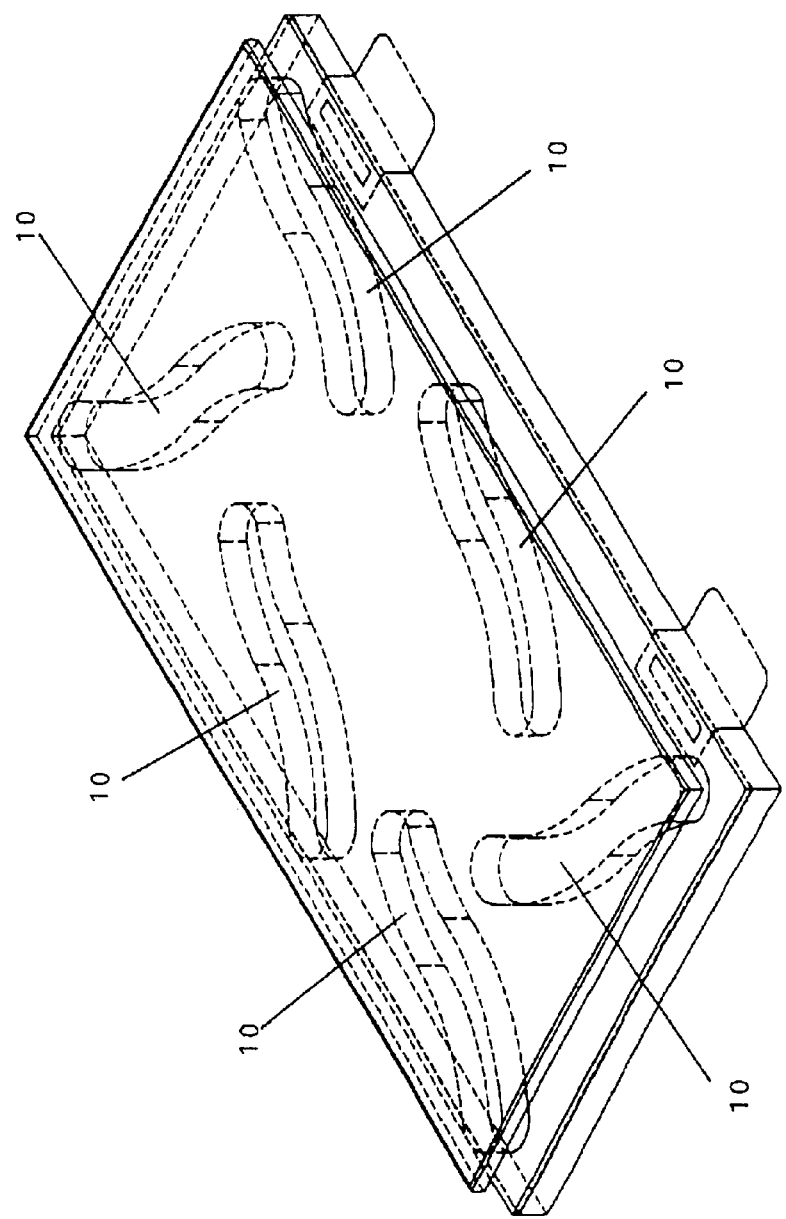
FIG. 9 shows a perspective view of another embodiment of the photovoltaic cooling system.
Figure 10:
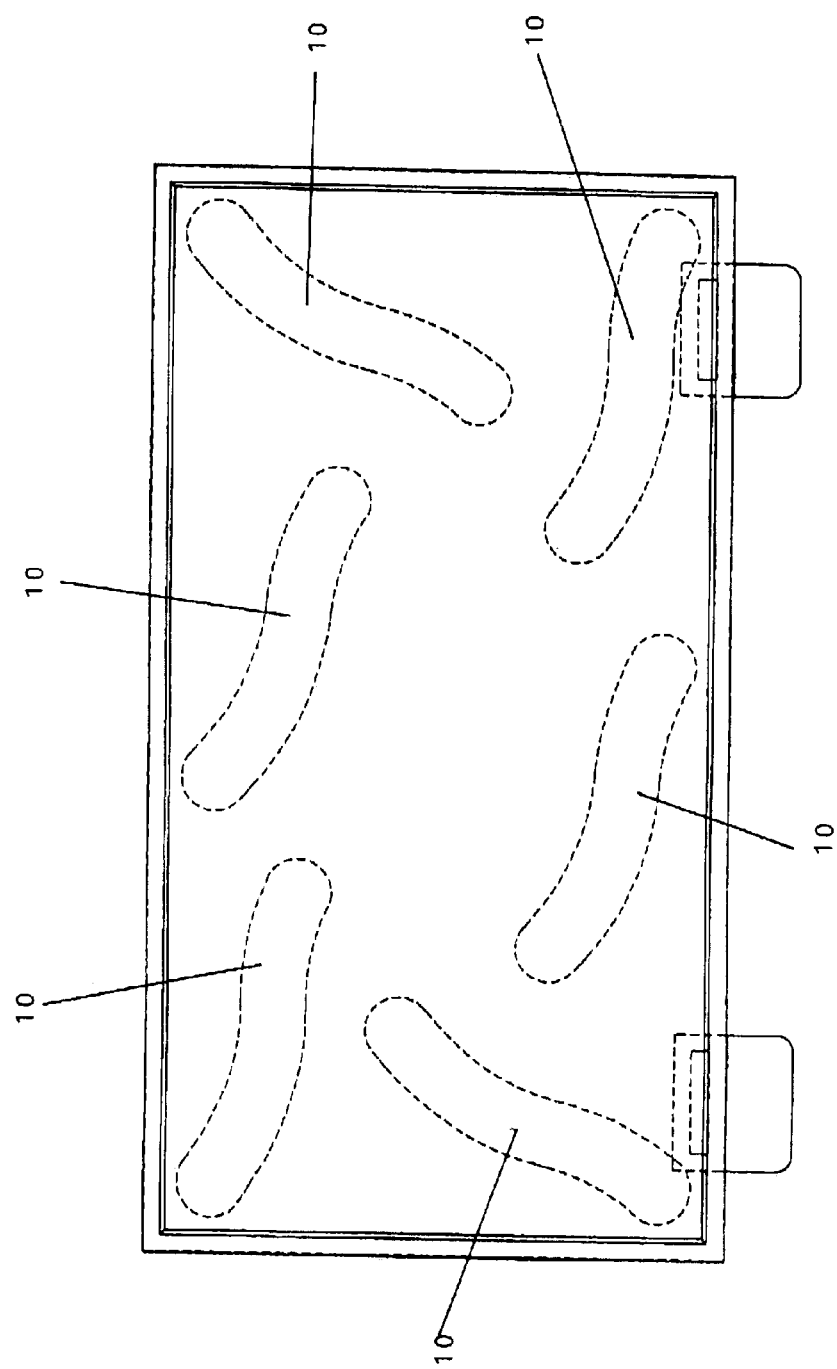
FIG. 10 shows the top view of the photovoltaic cooling system shown in FIG. 9.

FIG. 9 shows another embodiment of the photovoltaic cooling system. In this embodiment, six elongated curved members 10 shaped generally in the form of the letter "S" are attached under a generally rectangular solar module. Four of the elongated curved members 10 are attached under the solar module with one end near a corner and the other end directed generally toward the center of the solar module. The other two elongated curved members 10 are attached under the solar module with one end near the longer sides of the solar module and the other end offset towards the center of the solar module. FIG. 10 is the top view of the photovoltaic cooling system shown in FIG. 9.

Figure 11:
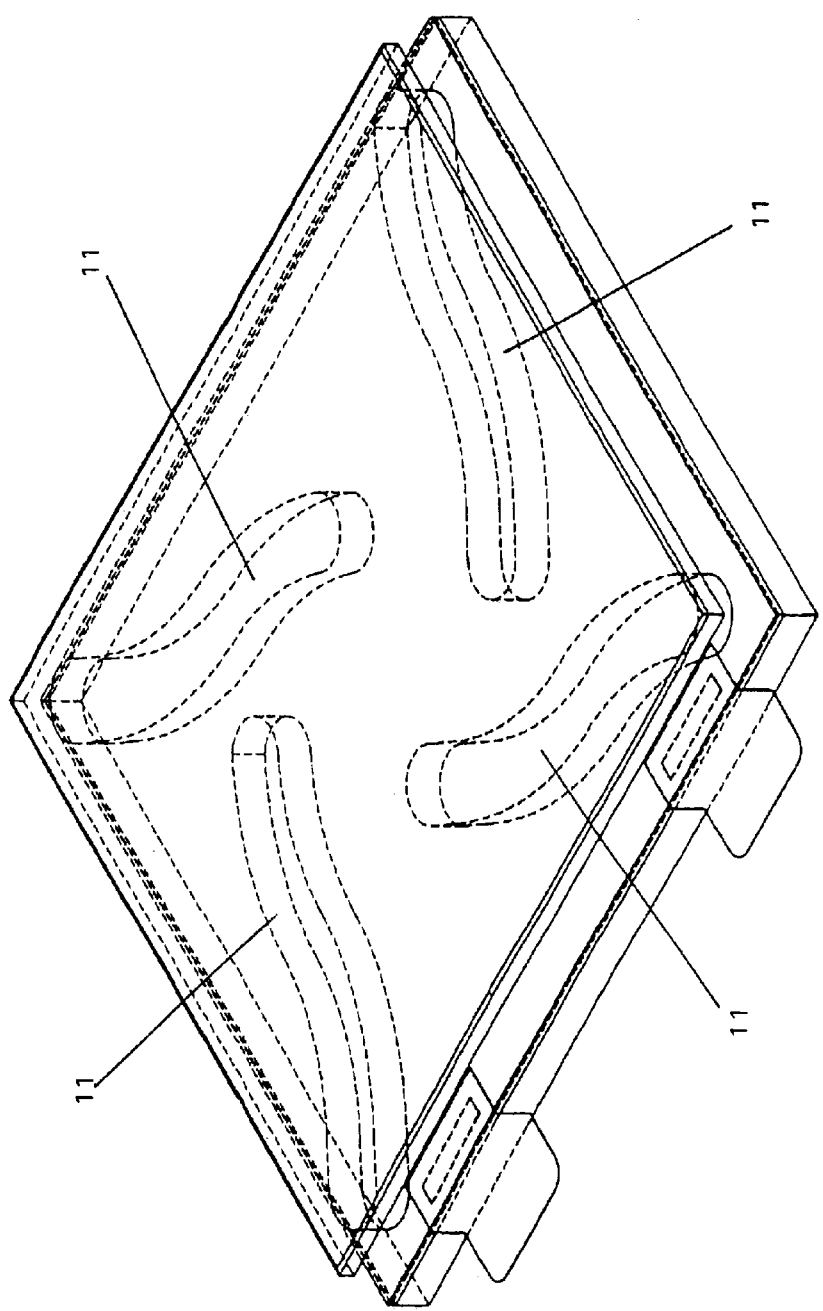
FIG. 11 shows a perspective view of another embodiment of the photovoltaic cooling system.
Figure 12:
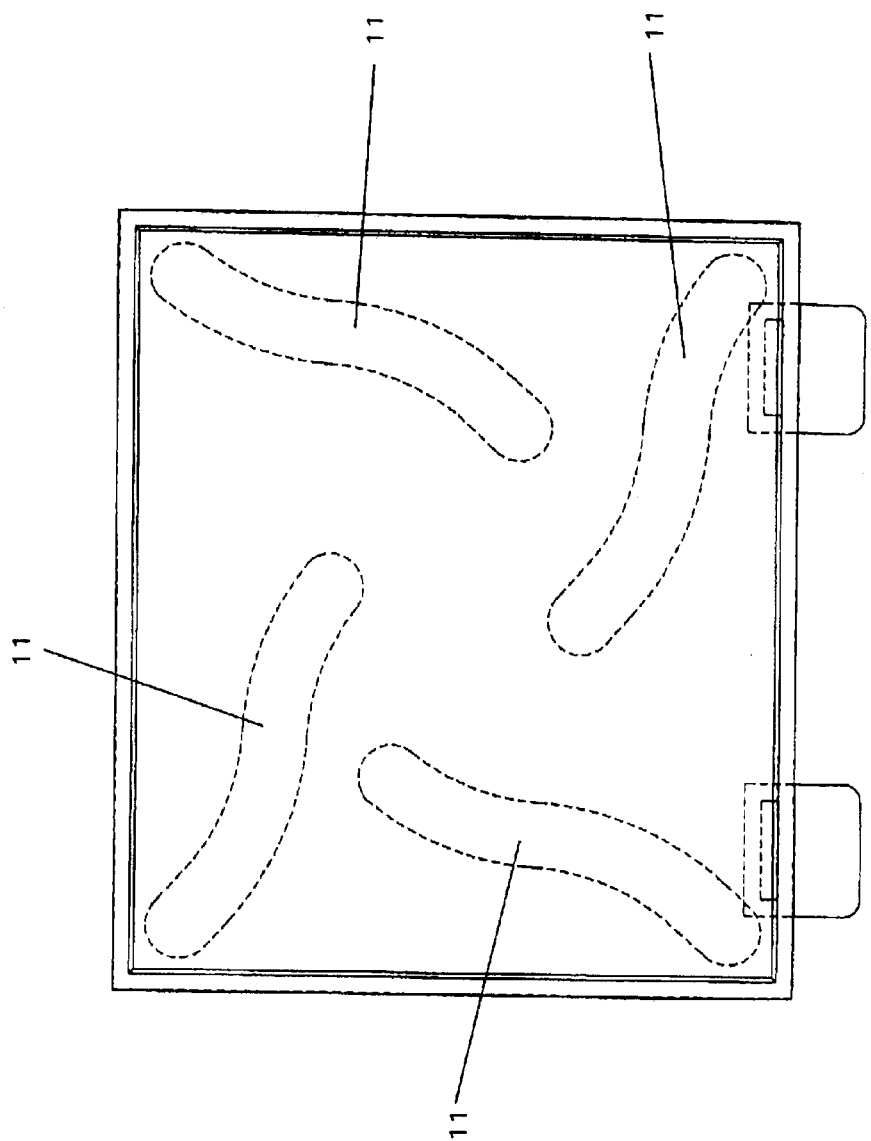
FIG. 12 shows the top view of the photovoltaic cooling system shown in FIG. 11.

FIG. 11 shows a photovoltaic cooling system with a relatively square solar module. Under the solar module are attached four elongated curved members 11 shaped generally in the form of the letter "S." Each of the four elongated curved members 11 are attached under the solar module with one end near a corner and the other end directed generally toward the center of the solar module. FIG. 12 is the top view of the photovoltaic cooling system shown in FIG. 11

Figure 13:
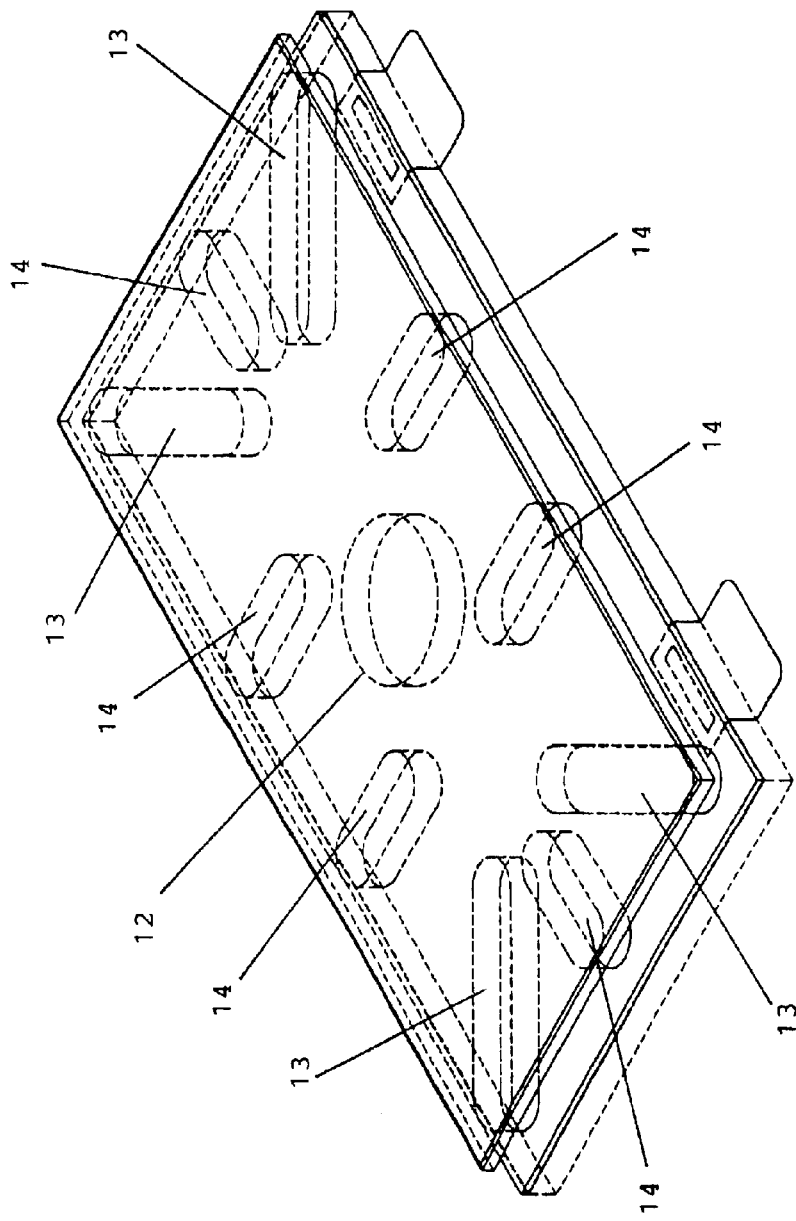
FIG. 13 shows a perspective view of another embodiment of the photovoltaic cooling system.
Figure 14:
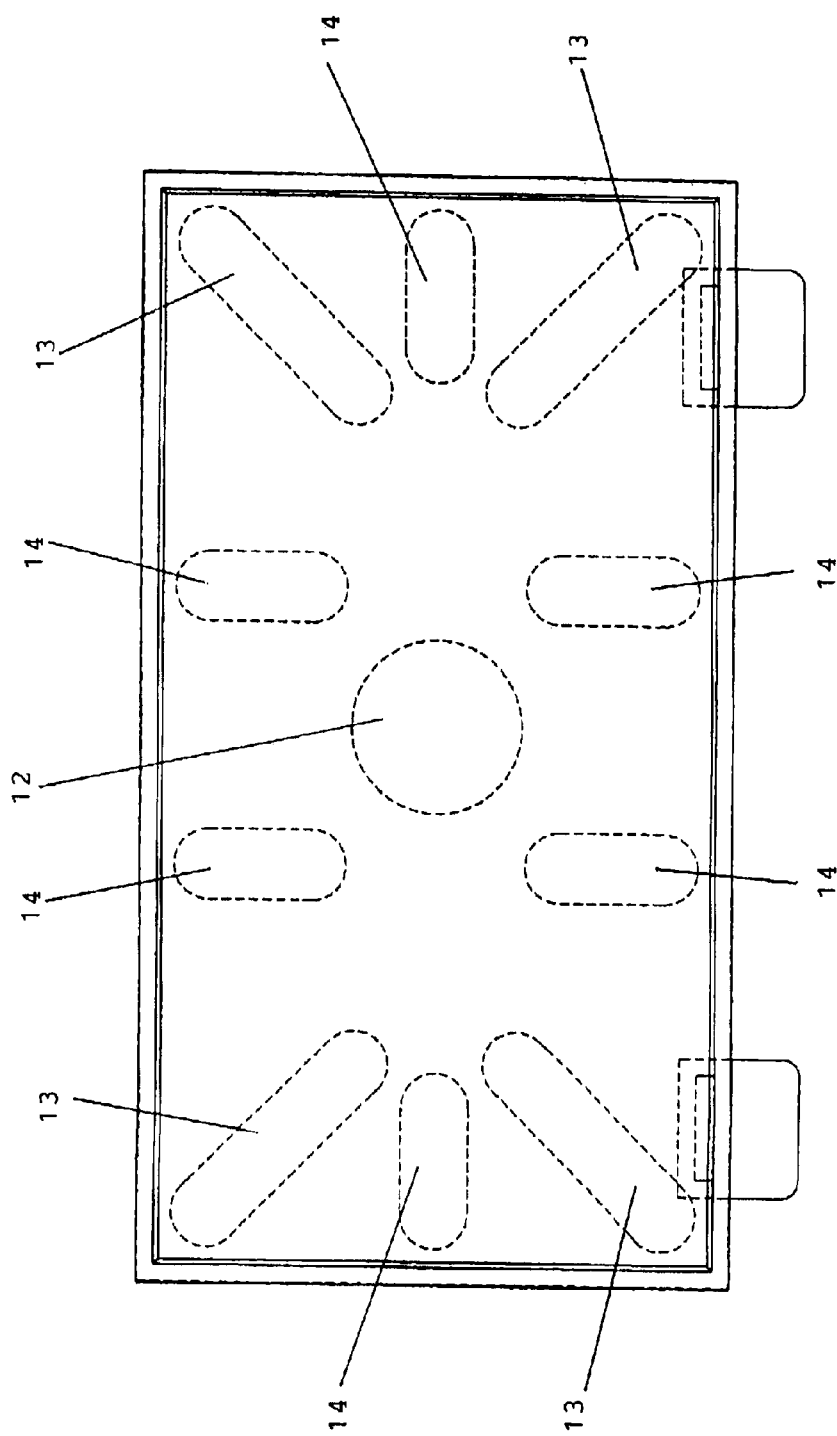
FIG. 14 shows the top view of the photovoltaic cooling system shown in FIG. 13.

FIG. 13 shows another embodiment of the photovoltaic cooling system. In this embodiment, a circular column 12 is attached under the approximate center of the solar module. Four short elongated members 13 are arranged radially near each corner of the solar module with one end directed toward the corner and the other end directed toward the circular column 12. Six other short elongated members 14 are arranged orthogonally with two short elongated members 14 perpendicular to each of the longer sides and one short elongated member 14 perpendicular to each of the shorter sides of the solar module. FIG. 14 is the top view of the photovoltaic cooling system shown in FIG. 13.

Figure 15:
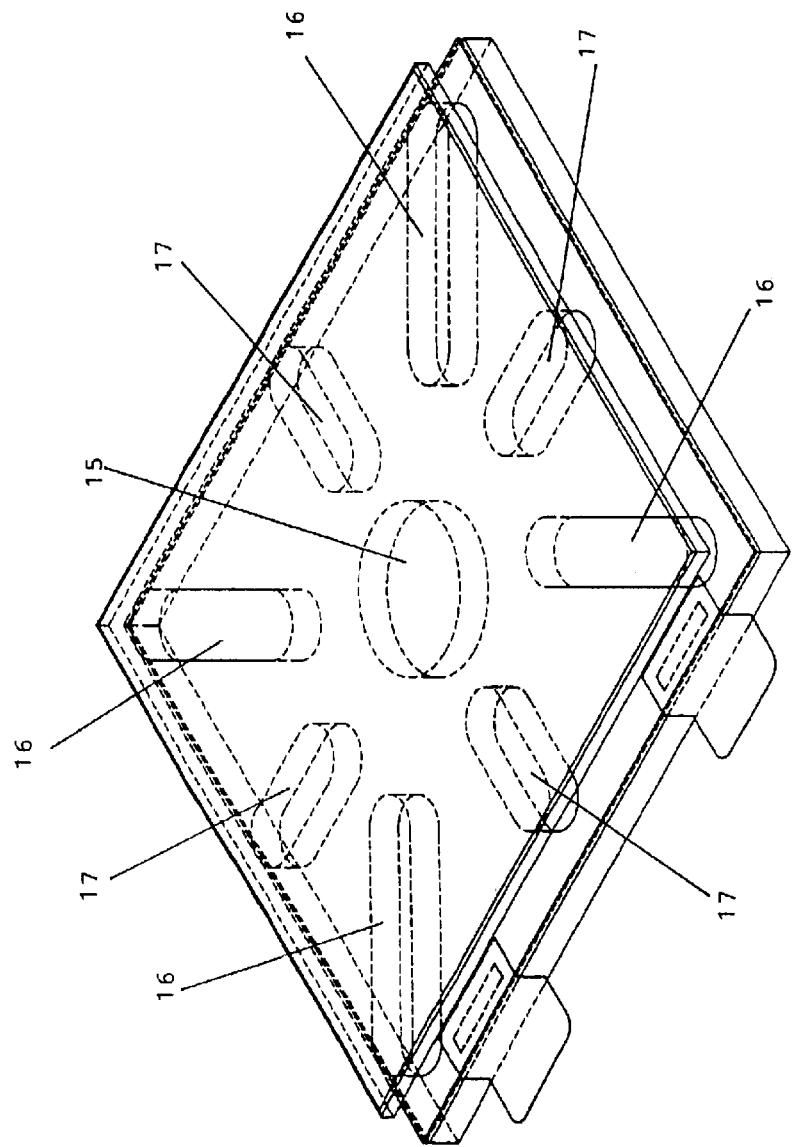
FIG. 15 shows a perspective view of another embodiment of the photovoltaic cooling system.
Figure 16:
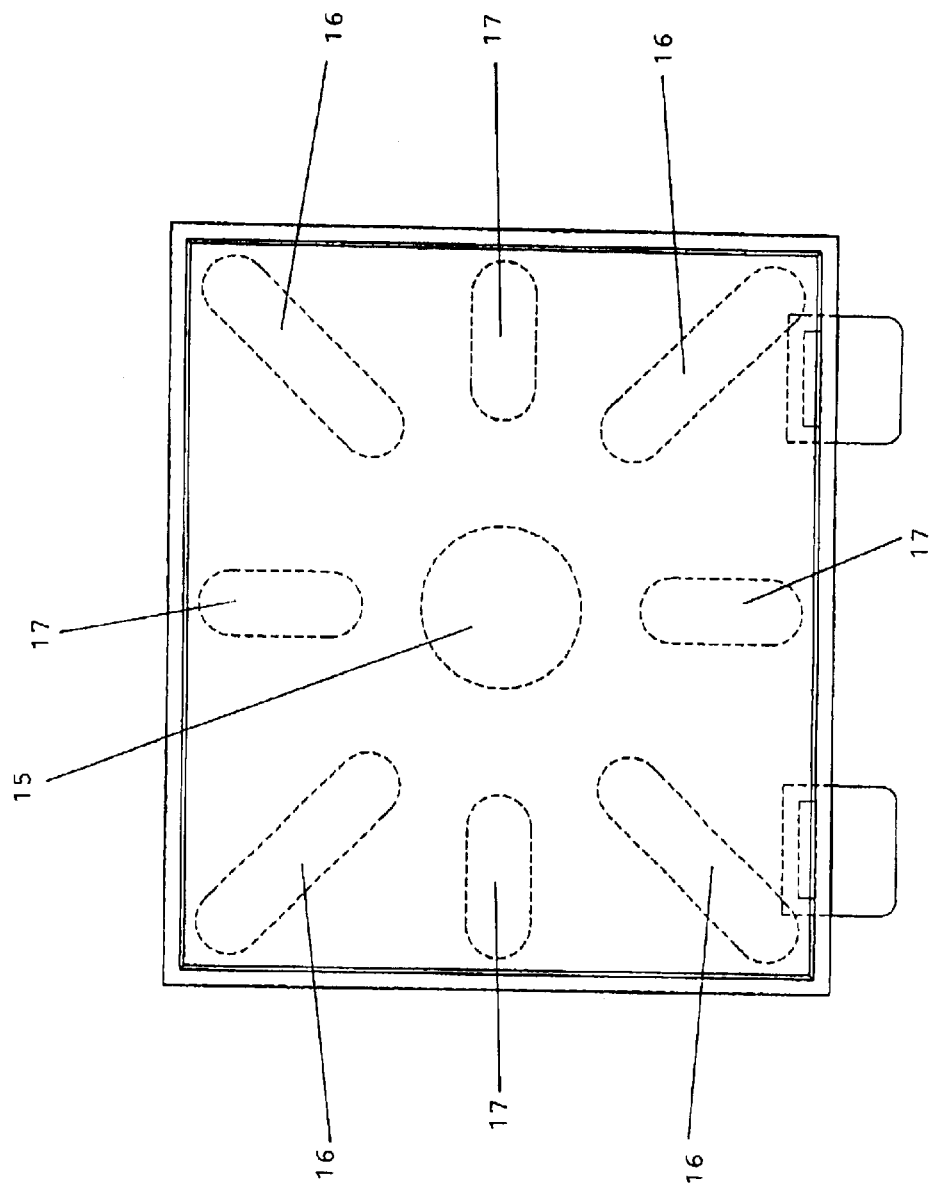
FIG. 16 shows the top view of the photovoltaic cooling system shown in FIG. 15.

FIG. 15 shows another embodiment of the photovoltaic cooling system with a relatively square solar module. In this embodiment, a circular column 15 is attached under the approximate center of the solar module. Four short elongated members 16 are arranged radially near each corner of the solar module with one end directed toward the corner and the other end directed toward the circular column 15. Four other short elongated members 17 are arranged orthogonally with one short elongated member 17 perpendicular to each of the sides of the solar module. FIG. 16 is the top view of the photovoltaic cooling system shown in FIG. 15.

The photovoltaic cooling system utilized aerodynamic principles to direct natural air flow under the solar module with members in various configurations to increase heat transfer under the solar module to greatly increase the convection rate and increase the effective cooling rate of the solar module.

Although the description above contains many specificities, these should not be construed as limiting the scope of the invention but as merely providing illustrations of some of the presently preferred embodiments of this invention. Thus the scope of the invention should be determined by the appended claims and their legal equivalents, rather than by the examples given.

What is claimed is:

1. A photovoltaic cooling system comprising a photovoltaic panel with multiple members affixed under the photovoltaic panel wherein each of the multiple members affixed under the photovoltaic panel has a first end and a second end wherein the first end has a rounded profile and the second end has a forty-five degree angle from top to bottom and wherein said multiple members affixed under the photovoltaic panel direct the natural air flow using aerodynamic principles to increase the rate of heat transfer under the photovoltaic panel thereby cooling the photovoltaic panel.

2. A photovoltaic cooling system comprising a photovoltaic panel with multiple members affixed under the photovoltaic panel wherein the photovoltaic panel has two parallel long sides and two parallel short sides wherein a circular column is attached under the approximate center of the solar module, four short elongated members are arranged radially near each corner of the solar module with one end directed toward the corner and the other end directed toward the circular column, and six other short elongated members are arranged orthogonally with two short elongated members perpendicular to each of the long sides and one short elongated member perpendicular to each of the short sides of the solar module and wherein said multiple members affixed under the photovoltaic panel direct the natural air flow using aerodynamic principles to increase the rate of heat transfer under the photovoltaic panel thereby cooling the photovoltaic panel.

3. A photovoltaic cooling system comprising a photovoltaic panel with multiple members affixed under the photovoltaic panel wherein the photovoltaic panel has four sides of equal length and four corners and each of the multiple members affixed under the photovoltaic panel is curved generally in the shape of the letter "S" with a first end directed toward a corner and a second end directed generally toward the center of the solar module and wherein said multiple members affixed under the photovoltaic panel direct the natural air flow using aerodynamic principles to increase the rate of heat transfer under the photovoltaic panel thereby cooling the photovoltaic panel.

4. A photovoltaic cooling system comprising a photovoltaic panel with multiple members affixed under the photovoltaic panel wherein the photovoltaic panel has two parallel long sides and two parallel short sides and four corners wherein four members affixed under the photovoltaic panel are curved generally in the shape of the letter "S" each with a first end directed toward a corner and a second end directed generally toward the center of the solar module and two members affixed under the photovoltaic panel are curved generally in the shape of the letter "S" with a first end directed toward a long side of the solar module and a second end directed generally toward the center of the solar module and wherein said multiple members affixed under the photovoltaic panel direct the natural air flow using aerodynamic principles to increase the rate of heat transfer under the photovoltaic panel thereby cooling the photovoltaic panel.

5. A photovoltaic cooling system comprising a photovoltaic panel with multiple members affixed under the photovoltaic panel wherein each of the multiple members affixed under the photovoltaic panel has a first end and a second end and is arranged with the first end near a corner of the photovoltaic panel and the second end offset toward the center of the photovoltaic panel and wherein said multiple members affixed under the photovoltaic panel direct the natural air flow using aerodynamic principles to increase the rate of heat transfer under the photovoltaic panel thereby cooling the photovoltaic panel.

6. A photovoltaic cooling system as in claim 5, wherein the photovoltaic panel has a pair of long sides and a pair of short sides and two members along the long sides are offset five degrees toward the center of the photovoltaic panel and two members along the short sides are offset ten degrees toward the center.

* * * * *